United States Patent
Vernickel et al.

(10) Patent No.: US 10,641,851 B2
(45) Date of Patent: May 5, 2020

(54) RADIO FREQUENCY COIL-ARRAY FOR MAGNETIC RESONANCE EXAMINATION SYSTEM

(71) Applicant: KONINKLIJKE PHILIPS N.V., Eindhoven (NL)

(72) Inventors: Peter Vernickel, Eindhoven (NL); Christian Findelkee, Eindhoven (NL); Christoph Leussler, Eindhoven (NL)

(73) Assignee: Koninklijle Philips N.V., Eindhoven (NL)

( * ) Notice: Subject to any disclaimer, the term of this patent is extended or adjusted under 35 U.S.C. 154(b) by 0 days.

(21) Appl. No.: 16/060,039

(22) PCT Filed: Dec. 8, 2016

(86) PCT No.: PCT/EP2016/080211
§ 371 (c)(1),
(2) Date: Jun. 7, 2018

(87) PCT Pub. No.: WO2017/097881
PCT Pub. Date: Jun. 15, 2017

(65) Prior Publication Data
US 2018/0364319 A1  Dec. 20, 2018

(30) Foreign Application Priority Data
Dec. 8, 2015 (EP) .................................... 15198397

(51) Int. Cl.
*G01R 33/36* (2006.01)
*G01R 33/3415* (2006.01)

(52) U.S. Cl.
CPC ....... *G01R 33/365* (2013.01); *G01R 33/3415* (2013.01)

(58) Field of Classification Search
CPC .......................... G01R 33/365; G01R 33/3415
USPC ........................................................ 324/307
See application file for complete search history.

(56) References Cited

U.S. PATENT DOCUMENTS

| | | | |
|---|---|---|---|
| 5,489,847 A | 2/1996 | Nabeshima et al. | |
| 7,449,888 B1 | 11/2008 | Malik et al. | |
| 8,258,789 B2 | 9/2012 | Boskamp | |
| 8,674,699 B2 | 3/2014 | Biber et al. | |
| 8,674,799 B2 | 3/2014 | Taracila et al. | |
| 8,742,759 B2 | 6/2014 | Knierim | |
| 2003/0164704 A1* | 9/2003 | Yoshida | G01R 33/3415 324/322 |
| 2004/0124840 A1 | 7/2004 | Reykowski | |
| 2006/0061360 A1* | 3/2006 | Leussler | G01R 33/3415 324/318 |
| 2007/0279062 A1 | 12/2007 | Greim et al. | |
| 2011/0148415 A1 | 6/2011 | Boskamp | |
| 2012/0001715 A1 | 1/2012 | La Taraci | |
| 2013/0093425 A1 | 4/2013 | Chu et al. | |
| 2013/0123612 A1 | 5/2013 | Rothard | |
| 2015/0002156 A1 | 1/2015 | Leussler et al. | |

* cited by examiner

Primary Examiner — Reena Aurora

(57) ABSTRACT

A radio frequency (RF) coil array with multiple RF coil elements for a magnetic resonance examination system is disclosed. The decoupling of RF coil elements involves sets (pairs) of transformers and may also include geometrical overlap of adjacent coils. The mutual coupling between the transformers is adjustable. This provides additional degrees of freedom to fully decouple the RF coil elements from each other.

13 Claims, 5 Drawing Sheets

Tiltable cores:

502: A larger diameter ring carrying two windings, to be rotated arround ist single mech. support 501: A longer cylinder carrying two other windings, mechanically fix Mech. support Resonant loop with variable distance to the trafos Planar transformer 1        Planar transformer 2

1+2: May be next to each other or coplanar

RADIO FREQUENCY COIL-ARRAY FOR MAGNETIC RESONANCE EXAMINATION SYSTEM

CROSS REFERENCE TO RELATED APPLICATIONS

This application is a U.S. national phase application of International Application No. PCT/EP2016/080211, filed on Dec. 8, 2016, which claims the benefit of EP Application Serial No. 15198397.0 filed on Dec. 8, 2015 and is incorporated herein by reference.

FIELD OF THE INVENTION

Magnetic resonance imaging (MRI) methods utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MRI method in general, the body of the patient to be examined is arranged in a strong, uniform magnetic field B0 whose direction at the same time defines an axis (normally the z-axis) of the co-ordinate system to which the measurement is related. The magnetic field B0 causes different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the corresponding magnetic field B1 of this RF pulse extends perpendicular to the z-axis, so that the magnetization performs a precession motion about the z-axis. The precession motion describes a surface of a cone whose angle of aperture is referred to as flip angle. The magnitude of the flip angle is dependent on the strength and the duration of the applied electromagnetic pulse. In the example of a so-called 90° pulse, the magnetization is deflected from the z axis to the transverse plane (flip angle 90°).

After termination of the RF pulse, the magnetization relaxes back to the original state of equilibrium, in which the magnetization in the z direction is built up again with a first time constant T1 (spin lattice or longitudinal relaxation time), and the magnetization in the direction perpendicular to the z-direction relaxes with a second and shorter time constant T2 (spin-spin or transverse relaxation time). The transverse magnetization and its variation can be detected by means of receiving RF antennae (coil arrays) which are arranged and oriented within an examination volume of the magnetic resonance examination system in such a manner that the variation of the magnetization is measured in the direction perpendicular to the z-axis. The decay of the transverse magnetization is accompanied by dephasing taking place after RF excitation caused by local magnetic field inhomogeneities facilitating a transition from an ordered state with the same signal phase to a state in which all phase angles are uniformly distributed. The dephasing can be compensated by means of a refocusing RF pulse (for example a 180° pulse). This produces an echo signal (spin echo) in the receiving coils.

In order to realize spatial resolution in the subject being imaged, such as a patient to be examined, constant magnetic field gradients extending along the three main axes are superposed on the uniform magnetic field B0, leading to a linear spatial dependency of the spin resonance frequency. The signal picked up in the receiving antennae (coil arrays) then contains components of different frequencies which can be associated with different locations in the body. The signal data obtained via the receiving coils correspond to the spatial frequency domain of the wave-vectors of the magnetic resonance signal and are called k-space data. The k-space data usually include multiple lines acquired of different phase encoding. Each line is digitized by collecting a number of samples. A set of k-space data is converted to an MR image by means of Fourier transformation.

The transverse magnetization dephases also in presence of constant magnetic field gradients. This process can be reversed, similar to the formation of RF induced (spin) echoes, by appropriate gradient reversal forming a so-called gradient echo. However, in case of a gradient echo, effects of main field inhomogeneities, chemical shift and other off-resonances effects are not refocused, in contrast to the RF refocused (spin) echo.

The invention pertains to a radio frequency coil array for a magnetic resonance examination system.

BACKGROUND OF THE INVENTION

Such a radio frequency (RF) coil-array is known from the U.S. Pat. No. 8,258,789. The known RF coil array has a first and a second RF coil integrated into a printed circuit board (PCB). Adjacently to the PCB a tuning member is positioned and inductively coupled to the RF coils. The tuning member is configured to minimize mutual inductance between the RF coils. The US patent application US2007/0279062. This US-patent application discloses a double resonance coil having pairs of coils. In one pair of coils the coil loops are decoupled from another by a transformer. The capacitances and inductances of the coil loops with the inductances and (inherent) (self-) capacitances of the inductors loops forming the transformer create a double resonant structure. The resonance frequencies can be adjusted by varying the distance between the inductances forming the transformer.

SUMMARY OF THE INVENTION

An object of the invention is to provide an RF coil array of which the decoupling of RF coils is improved.

This object is achieved by the RF coil array comprising
multiple RF coil elements,
sets, in particular pairs, of transformers arranged between adjacent RF coil elements and
transformers of said sets having a mutual coupling which compensates for a mutual coupling between the adjacent RF coil elements.

The invention concerns a radio frequency (RF) coil array with multiple RF coil elements for a magnetic resonance examination system. The decoupling of RF coil elements involves sets (pairs) of transformers and may also include geometrical overlap of adjacent coils. The mutual coupling between the transformers is adjustable. This provides additional degrees of freedom to fully decouple the RF coil elements from each other. Mutual coupling of transformers within a set indicates the coupling of one transformed to the other transformer(s) in the same set and vice versa. Sets of transformers are formed by the transformers arranged between adjacent RF coil elements (loops).

The radio frequency (RF) coil array of the invention comprises multiple coils arranged in a two-dimensional pattern that is spanned by a first and a second principal axis. Usually the two dimensional pattern is a square or rectangular grid. Alternatively, a triangular, pentagonal, hexagonal grid pattern can be used. The two-dimensional pattern has mutually transverse diagonal axes each having an orientation between the first and second principal axes. In the RF coil array a first transformer electromagnetically decouples coils offset along the first diagonal axis. A second transformer decouples coils offset along the second diagonal axis. Geometrical overlap may be provided between coils offset along the first principal axis. The first and second transformers are coupled to compensate coupling between coils offset along the second principal axis. An insight of the invention is that the amount of decoupling by overlap between the coils, the transformer coupling-strengths, and mutual transformer decoupling-strengths between diagonal coils provide sufficiently many degrees of freedom to fully decouple the array. The decoupling can be done accurately by adjusting these three degrees of freedom. Moreover, these three degrees of freedom are achieved by way of a relatively simple configuration of the array, and without hardly additional components. Moreover, the construction of the coils is hardly affected, so that the coils can be separately optimized for high sensitivity of magnetic resonance signals. According to a related insight of the invention, instead of adjusting overlap between coils, transformers may be employed at the position where three or more coils meet and decouple these three or more coils as well as adjust the coupling between the transformers at that position. Notably, the first transformer may decouple one of these three coils from the remaining pair of coils. The second transformer may mutually decouple the coils of that remaining pair. In one example, the first transformer includes a first common core with two sub-windings that are displaced along the first common core. The second transformer may be formed from a single winding around a second core. The displacement between the windings around the first common core may be adjustable. The orientation of the second winding may be adjustable relative to the orientation of the sub-windings. This can be achieved by tilting the second winding relative to (its) second core or by tilting the second core with its second winding relative to the first common core.

The transformer coupling-strengths between the transformers of the pair can be varied on the basis of the relative orientation of the cores of the transformers or on the basis of the spatial separation between transformer windings of the transformers. For example each transformer be formed as a pair of planar windings that may displaceable parallel to the (parallel or coincident) plane(s) of the planar windings. In another example, the transformer may be formed with at least one of the windings including sub-windings that are displaceable along their common or parallel longitudinal axes.

The mutual orientation or spatial separation of the transformers may be coarsely or finally fixed in manufacture of the RF coil array. Further fine tuning can optionally be done by active tuning measures for each individual patient. The mutual orientation of the cores or the spacing between the windings may be adjusted to the individual patient to be examined. The transformer couplings may also be adjusted to compensate for deformation of the coil-array. The decoupling strength of diagonally offset coils by the transformer may be adjusted during the examination in a pneumatic manner or by way of a screw driven by a remote motor-drive.

These and other aspects of the invention will be further elaborated with reference to the embodiments defined in the dependent Claims.

In an embodiment of the invention, the first and second transformers each have an elongate transformer core orientated at an angle which affects direct coupling between the transformers. The transformer-windings, which may e.g. be just one or a few wire-loops are wound around the transformer core. The elongate transformer core is made from a non-magnetic electrically conducting material. Preferably a non-magnetic metal, such as aluminium or copper achieves favorable results. Also transformer cores may be of non-magnetic, electrically non-conducting material such as plastic that serve just to hold the transformer windings in their proper position and orientation.

In another embodiment of the invention discrete coupling elements are employed to generate coupling between the transformers. In particular capacitors, inductors of transmission lines can be used as the discrete coupling elements.

These and other aspects of the invention will be elucidated with reference to the embodiments described hereinafter and with reference to the accompanying drawing wherein

DETAILED DESCRIPTION OF THE EMBODIMENTS

Figure 1:
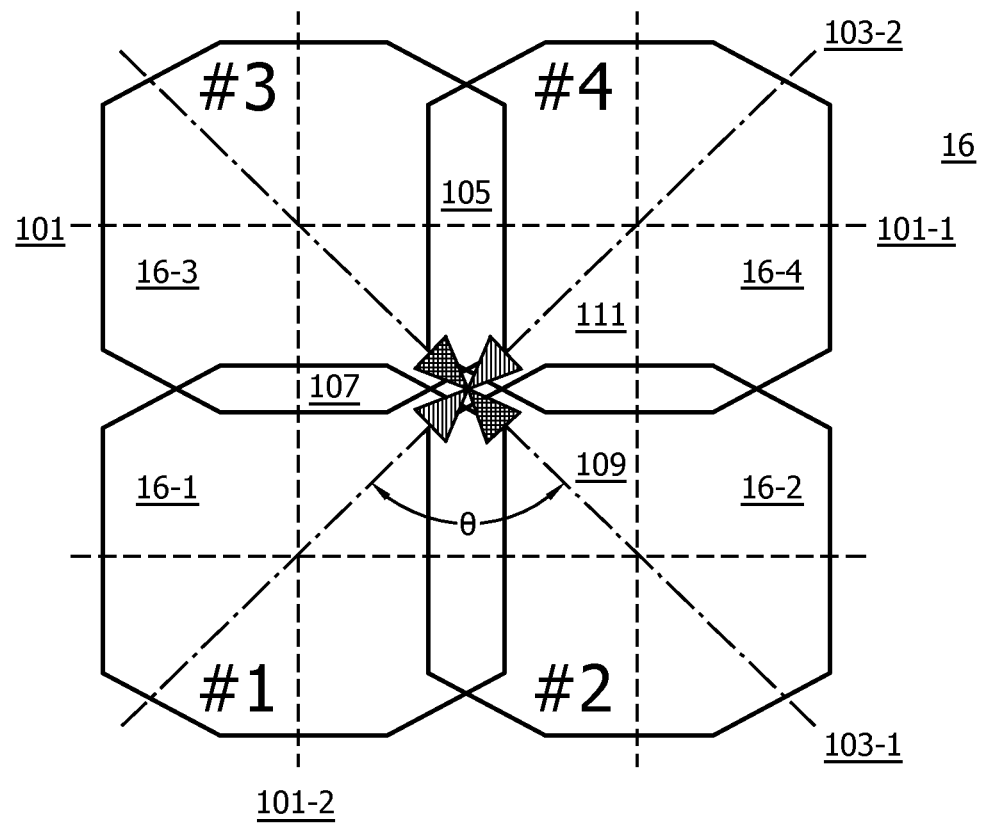
FIG. 1 shows a diagrammatic representation of an example of the radio frequency coil array of the invention.

FIG. 1 shows a diagrammatic representation of an example of the radio frequency coil array of the invention. In this example an RF coil array 16 is shown with only four coils 16-1, 16-2, 16-3, 16-2. The coils are arranged in a square grid pattern indicated with the dashed grid lines 101. Diagonal axes 103-1,2 are indicated by dash-dotted lines at angles of $\pi/4$ to the grid lines 101. The grid lines form the first principal axes 101-1 and the second principal axes 101-2. The first principal axes are parallel to each other, as are the second principal axes. The first principal axes are at right angles to the second principal axes. The FIG. 1 shows geometrical overlap 105 between coils that are spatially offset along the first principal axes 101-1. There is also shown geometrical overlap 107 between coils that are spatially offset along the second principal axes 101-2. The spatial offsets along the principal axes are named lateral offset. Further the first transformer 109 is arranged to couple coils 16-3, 16-2 offset along the first diagonal axis 103-1, i.e. diagonally offset. The second transformer 111 is arranged to couple coils 16-1, 16-4 that are offset along the second diagonal axis 103-2. The first and second transformers are orientated such that their transformer-cores are orientated relative to each other by the angle $\theta$.

Figure 2:
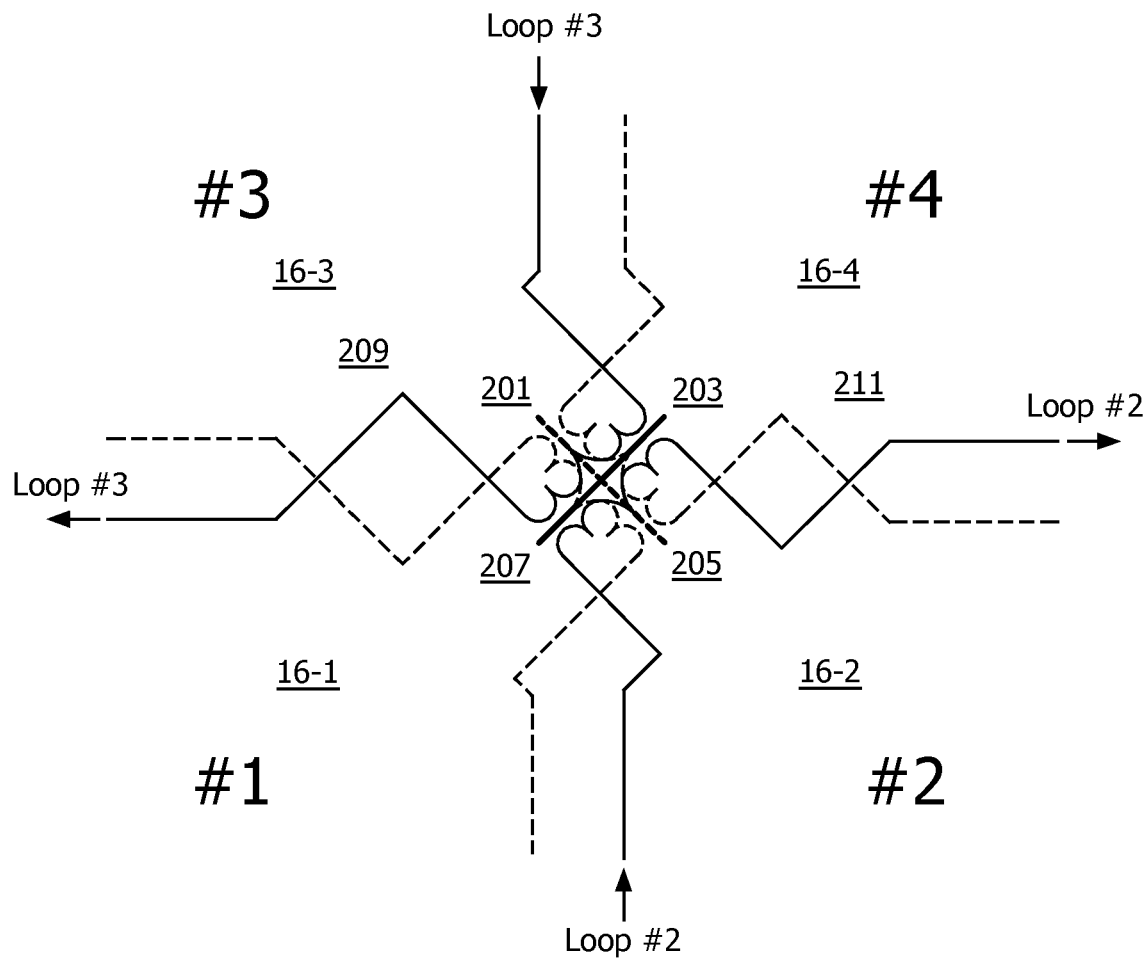
FIG. 2 shows a diagrammatic representation of an example of the dual transformer coupling of the radio frequency coil array of FIG. 1.

FIG. 2 shows a diagrammatic representation of an example of the dual transformer coupling of the radio frequency coil array of FIG. 1. The transformers 109 and 111, each comprise a core 201,203, around which the transformer (primary and secondary) windings 205 and 207 of the respective transformers are wound. The transformers 109 and 111 are coupled to diagonal protrusions 209, 211 of the conductor loops of the coils 16-1, 16-4 and 16-2, 16-3, respectively that are diagonally offset. The transformer cores 201, 203 are orientated at the angle θ. The mutual coupling between the transformers depends on the angle θ.

Figure 3:
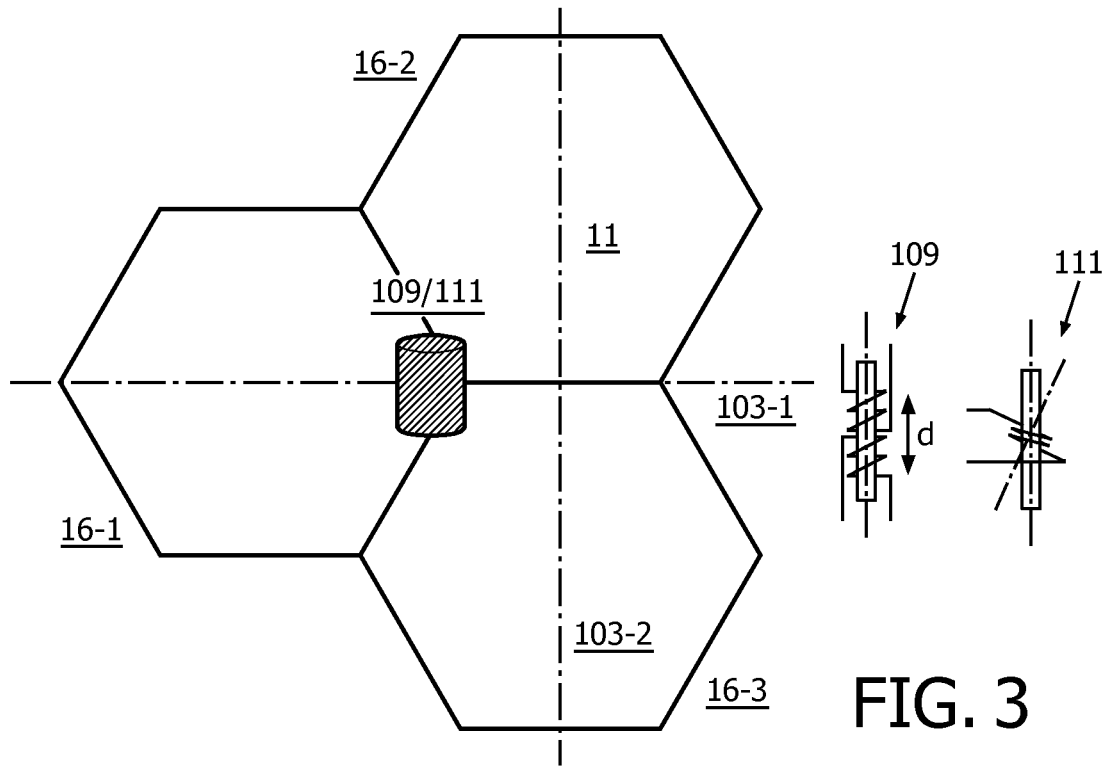

FIG. 3 shows a schematic example of a hexagonal coil-array of the invention. The hexagonal coils (coil loops) 16-1, 16-2, 16-3 are arranged in a hexagonal pattern with respect to the first and second principal axes 103-1, 103-2. The decoupling transformers 109 111 are placed where three hexagonal coils meet. One of the transformers 109 has a pair windings on the core and can be mutually displaced along the length of the core. The other transformer 111 has a single winding that can be tilted relative to its core. By changing the angle between the single winding and adjusting the distances between windings of the pair, the decoupling is adjusted. One transformer 109 decouples the pair of coils 16-2, 16-3. The other transformer 111 decouples the remaining coil 16-1 from the pair of coils 16-2, 16-3.

Figure 4:
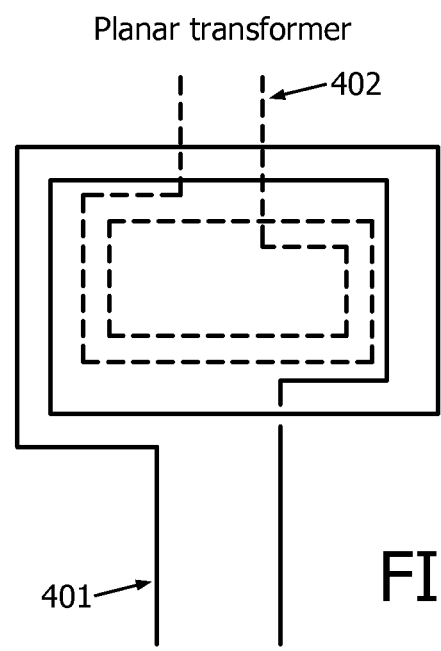
FIGS. 4, 5 and 6 show details of the adjustment of the mutual coupling between the transformers
Figure 5:
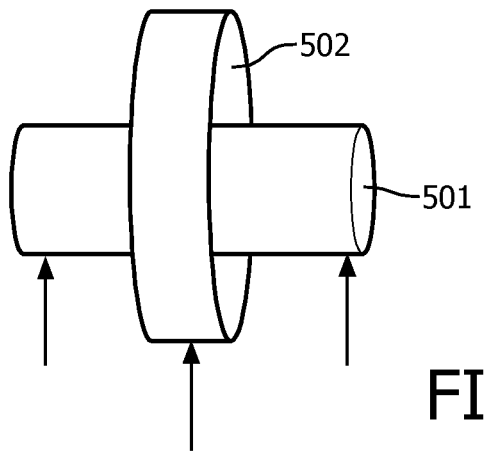
Figure 6:
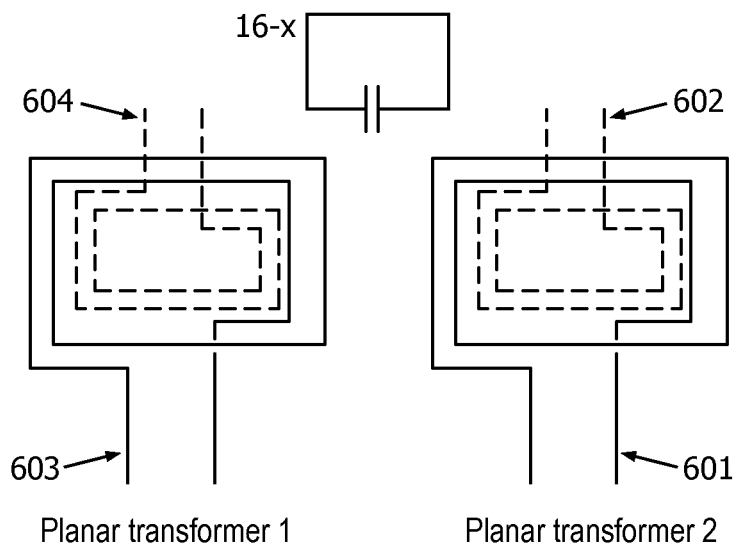

Details of the adjustment of the mutual coupling between the transformers are shown in FIGS. 4, 5 and 6. FIG. 4 shows a pair of planar windings forming the transformer. The windings can be displaced transverse to the parallel planes of the windings to adjust the decoupling. FIG. 5 shows a pair of transformers 109,111 of two pairs of windings each. One pair of windings is carried by a cylinder, the other pair of windings a ring of diameter larger than the diameter of the cylinder. Thus, the ring and cylinder may be tilted relative to each other. The height of the ring may be (much) smaller than the length of the cylinder.

FIG. 6 shows an example of a pair of transformers formed by pair of parallel planar windings. The pair of planar windings are laterally displaced along the plane(s) of the planar windings.

Figure 7:
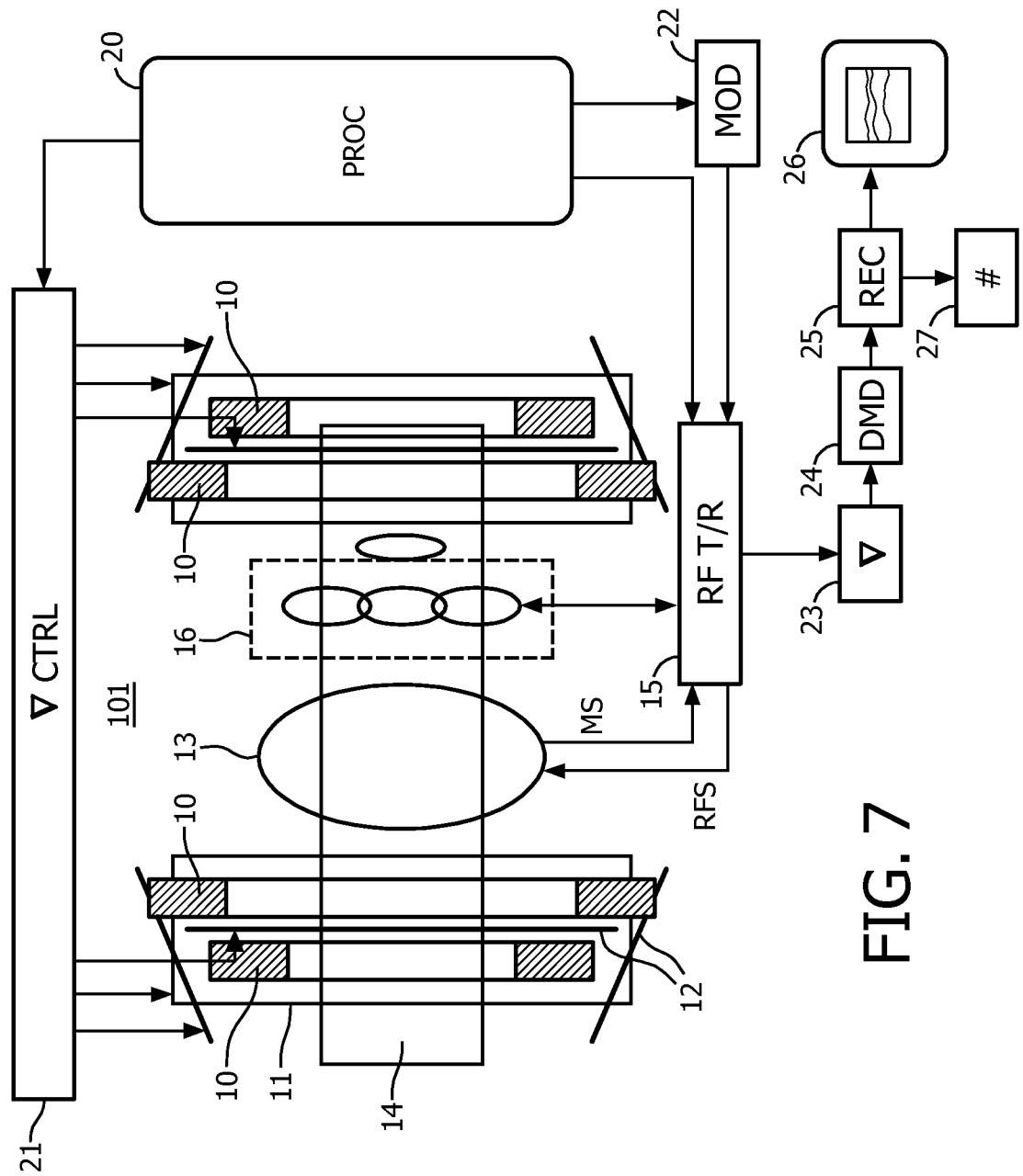
FIG. 7 shows a schematic representation of a magnetic resonance examination system in which the radio frequency coil array of the invention is employed.

FIG. 7 shows diagrammatically a magnetic resonance imaging system in which the invention is used. The magnetic resonance imaging system includes a main magnet with a set of main coils 10 whereby the steady, uniform magnetic field is generated. The main coils are constructed, for example in such a manner that they from a bore to enclose a tunnel-shaped examination space. The patient to be examined is placed on a patient carrier which is slid into this tunnel-shaped examination space. The magnetic resonance imaging system also includes a number of gradient coils 11, 12 whereby magnetic fields exhibiting spatial variations, notably in the form of temporary gradients in individual directions, are generated so as to be superposed on the uniform magnetic field. The gradient coils 11, 12 are connected to a gradient control 21 which includes one or more gradient amplifier and a controllable power supply unit. The gradient coils 11, 12 are energized by application of an electric current by means of the power supply unit 21; to this end the power supply unit is fitted with electronic gradient amplification circuit that applies the electric current to the gradient coils so as to generate gradient pulses (also termed 'gradient waveforms') of appropriate temporal shape. The strength, direction and duration of the gradients are controlled by control of the power supply unit. The magnetic resonance imaging system also includes transmission and receiving antennae (coils or coil arrays) 13, 16 for generating the RF excitation pulses and for picking up the magnetic resonance signals, respectively. The transmission coil 13 is preferably constructed as a body coil 13 whereby (a part of) the object to be examined can be enclosed. The body coil is usually arranged in the magnetic resonance imaging system in such a manner that the patient 30 to be examined is enclosed by the body coil 13 when he or she is arranged in the magnetic resonance imaging system. The body coil 13 acts as a transmission antenna for the transmission of the RF excitation pulses and RF refocusing pulses. Preferably, the body coil 13 involves a spatially uniform intensity distribution of the transmitted RF pulses (RFS). The same coil or antenna is generally used alternately as the transmission coil and the receiving coil. Typically, a receiving coil includes a multiplicity of elements, each typically forming a single loop. Various geometries of the shape of the loop and the arrangement of various elements are possible. The transmission and receiving coil 13 is connected to an electronic transmission and receiving circuit 15.

It is to be noted that is that there is one (or a few) RF antenna elements that can act as transmit and receive; additionally, typically, the user may choose to employ an application-specific receive antenna that typically is formed as an array of receive-elements. For example, surface coil arrays 16 can be used as receiving and/or transmission coils. Such surface coil arrays have a high sensitivity in a comparatively small volume. The receiving coil is connected to a preamplifier 23. The preamplifier 23 amplifies the RF resonance signal (MS) received by the receiving coil 16 and the amplified RF resonance signal is applied to a demodulator 24. The receiving antennae, such as the surface coil arrays, are connected to a demodulator 24 and the received pre-amplified magnetic resonance signals (MS) are demodulated by means of the demodulator 24. The pre-amplifier 23 and demodulator 24 may be digitally implemented and integrated in the surface coil array. The demodulated magnetic resonance signals (DMS) are applied to a reconstruction unit. The demodulator 24 demodulates the amplified RF resonance signal. The demodulated resonance signal contains the actual information concerning the local spin densities in the part of the object to be imaged. Furthermore, the transmission and receiving circuit 15 is connected to a modulator 22. The modulator 22 and the transmission and receiving circuit 15 activate the transmission coil 13 so as to transmit the RF excitation and refocusing pulses. In particular the surface receive coil arrays 16 are coupled to the transmission and receive circuit by way of a wireless link. Magnetic resonance signal data received by the surface coil arrays 16 are transmitted to the transmission and receiving circuit 15 and control signals (e.g. to tune and detune the surface coils) are sent to the surface coils over the wireless link.

The reconstruction unit derives one or more image signals from the demodulated magnetic resonance signals (DMS), which image signals represent the image information of the imaged part of the object to be examined. The reconstruction unit 25 in practice is constructed preferably as a digital image processing unit 25 which is programmed so as to derive from the demodulated magnetic resonance signals the image signals which represent the image information of the part of the object to be imaged. The signal on the output of the reconstruction is applied to a monitor 26, so that the reconstructed magnetic resonance image can be displayed on the monitor. It is alternatively possible to store the signal from the reconstruction unit 25 in a buffer unit 27 while awaiting further processing or display.

The magnetic resonance imaging system according to the invention is also provided with a control unit 20, for example in the form of a computer which includes a (micro) processor. The control unit 20 controls the execution of the RF excitations and the application of the temporary gradient fields. To this end, the computer program according to the invention is loaded, for example, into the control unit 20 and the reconstruction unit 25.

The invention claimed is:

1. A radiofrequency (RF) coil array comprising:
   multiple RF coil elements,
   sets of transformers arranged between adjacent RF coil elements and
   transformers of said sets having a mutual coupling that compensates for a mutual coupling between the adjacent RF coil elements, and wherein
   the multiple coils arranged in a two-dimensional pattern that is spanned by a first and a second principal axis,
      mutually transverse diagonal axes each having an orientation between the first and second principal axes,
      a first transformer decoupling the coils offset along the first diagonal axis,
      a second transformer decoupling the coils offset along the second diagonal axis,
   wherein the first and second transformers are coupled to compensate coupling between coils offset along the second principal axis.

2. The RF coil array of claim 1, wherein the mutual coupling between transformers of a set is adjustable by displacing one or more windings associated with at least one of the first transformer or the second transformer.

3. The RF coil array of claim 1, wherein there is geometrical overlap between coils offset along the first principal axis.

4. The RF coil array of claim 1 wherein three or more coils meet at a single position and the first and second transformer are located at said meeting position to mutually decouple said three or more coils.

5. The RF coil array of claim 4, wherein the transformer windings are planar windings.

6. The RF coil array of claim 1, wherein
   the first and second transformers each have an elongate transformer core and
   the transformer cores being orientated at an angle which is adjustable and adjustment of the angle affects direct coupling between the transformers.

7. The RF coil array of claim 1, wherein transformer windings of the first and second transformers are spatially separated over and adjustable over a distance which affects direct coupling between the transformers.

8. A method of decoupling coils in the RF coil array of claim 7 including adjusting geometrical overlap between coils offset along the first principal axis.

9. The RF coil array of claim 1, wherein
   the first transformer includes two sub-windings around a common first core and mutually displaced along the length of the common core,
   the second transformer is formed by a single winding around a second core, and the second winding is tiltable with respect to the two sub-windings of the first transformer and
   the first transformer decoupling one pair of coils from the third coil and the second transformer mutually decoupling the coils of said pair.

10. The RF coil array of claim 1, wherein discrete coupling elements generate coupling between the transformers.

11. A method of decoupling coils in the RF coil array of claim 1 comprising:
    arranging the coils in a pre-determined two-dimensional pattern,
    decouple coil elements that are mutually offset along a diagonal axis,
    orientate or mutually displace the first and second transformers to compensate coupling between coils offset along the second principal axis.

12. The RF coil array of claim 1, wherein the sets of transformers are paired sets of transformers.

13. The RF coil array of claim 1, wherein the discrete coupling elements include at capacitors, inductors of transmission lines.

* * * * *